United States Patent
Schultz

(10) Patent No.: US 7,188,667 B2
(45) Date of Patent: Mar. 13, 2007

(54) LIQUID COOLING STRUCTURE FOR ELECTRONIC DEVICE

(75) Inventor: Mark D. Schultz, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/901,695

(22) Filed: Jul. 29, 2004

(65) Prior Publication Data

US 2006/0021747 A1    Feb. 2, 2006

(51) Int. Cl.
F28F 7/02 (2006.01)
(52) U.S. Cl. ..................... 165/185; 165/80.4
(58) Field of Classification Search ............... 165/185, 165/80.4, 80.5
See application file for complete search history.

(56) References Cited

U.S. PATENT DOCUMENTS

| | | | | |
|---|---|---|---|---|
| 2,965,819 A * | 12/1960 | Rosenbaum | ............... | 165/185 |
| 4,254,431 A * | 3/1981 | Babuka et al. | ............... | 165/185 |
| 4,498,530 A * | 2/1985 | Lipschutz | ............... | 165/185 |
| 4,535,841 A * | 8/1985 | Kok | ............... | 165/185 |
| 4,800,956 A * | 1/1989 | Hamburgen | ............... | 165/185 |
| 5,006,924 A * | 4/1991 | Frankeny et al. | ............... | 165/80.4 |
| 5,345,107 A | 9/1994 | Daikoku et al. | ............... | 257/717 |
| 5,365,402 A * | 11/1994 | Hatada et al. | ............... | 165/80.4 |
| RE35,721 E * | 2/1998 | Daikoku et al. | ............... | 165/185 |
| 5,858,537 A * | 1/1999 | Brown et al. | ............... | 165/185 |
| 6,191,944 B1 * | 2/2001 | Hammel et al. | ............... | 165/80.4 |
| 6,665,186 B1 * | 12/2003 | Calmidi et al. | ............... | 165/80.4 |
| 2005/0061474 A1 * | 3/2005 | Gelorme et al. | ............... | 165/80.2 |

* cited by examiner

Primary Examiner—Teresa J. Walberg
(74) Attorney, Agent, or Firm—Michael J. Buchenhorner; Casey P. August

(57) ABSTRACT

A structure for cooling an electronic device. The structure includes a first layer disposed over the electronic device for providing a heat path from the electronic device and a bottom layer including a fin structure and a lower surface opposite the fin structure, wherein the lower surface contacts the first layer. The structure further includes a liquid layer disposed over the fin structure of the bottom layer and a top layer including a fin structure and a top surface opposite the fin structure, wherein the fin structure of the top layer contacts the liquid layer. The structure further includes a heat sink in contact with or integral with the top layer.

17 Claims, 4 Drawing Sheets

LIQUID COOLING STRUCTURE FOR ELECTRONIC DEVICE

CROSS-REFERENCE TO RELATED APPLICATIONS

Not Applicable.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of cooling devices for electronic components, and more particularly relates to the field of heat sinks for microprocessors.

BACKGROUND OF THE INVENTION

During the normal operation of a computer, integrated circuit devices generate significant amounts of heat. This heat must be continuously removed, or the integrated circuit device may overheat, resulting in damage to the device and/or a reduction in operating performance. Cooling devices, such as heat sinks, have been used in conjunction with integrated circuit devices in order to avoid such overheating. Generally, a passive heat sink in combination with a system fan has provided a relatively cost-effective cooling solution. In recent years, however, the power of integrated circuit devices such as microprocessors has increased exponentially, resulting in a significant increase in the amount of heat generated by these devices, thereby necessitating a more efficient cooling solution.

It is becoming extremely difficult to extract the heat generated by semiconductor devices (processors, in particular) that continue to generate more and more heat in the same amount of space. Heat is typically extracted by coupling a heat spreader and thermal cap to the semiconductor and a heat sink. This coupling typically involves a thermal paste which serves to not only transfer heat but provide some degree of mechanical compliance to compensate for dimensional changes driven by the high temperatures. This paste is often a weak link in the thermal path. Attempts to thin this layer have resulted in failure of the layer when it is exposed to dimensional changes due to heat.

One approach to this problem involves spring loaded fingers with thermal paste in between them and a thermal paste interface to the chip. This solution is limited in performance by the thermal paste and in design by the requirement for consistent spring loading. Liquid metal has been proposed on its own as a thermal interface material, but could have significant difficulty dealing with large z-axis thermally induced excursions, requiring some compliance elsewhere in the package or (if the largest spacing seen is still thermally acceptable) some sort of edge reservoir design.

Therefore, a need exists to overcome the problems with the prior art as discussed above, and particularly for a way to cool small electronic devices using a thermally compliant material.

SUMMARY OF THE INVENTION

Briefly, according to an embodiment of the present invention, a structure for cooling an electronic device is disclosed. The structure includes a first layer disposed over the electronic device for providing a heat path from the electronic device and a bottom layer including a fin structure and a lower surface opposite the fin structure, wherein the lower surface contacts the first layer. The structure further includes a liquid layer disposed over the fin structure of the bottom layer and a top layer including a fin structure and a top surface opposite the fin structure, wherein the fin structure of the top layer contacts the liquid layer. The structure further includes a heat sink, which can be a typical air cooled heat sink or other heat sink such as a water cooled cold hat in contact with or integral with the top layer.

According to another embodiment of the present invention, the structure for cooling an electronic device includes a first layer disposed over the electronic device for providing a heat path from the electronic device and a bottom layer including a fin structure and a lower surface opposite the fin structure, wherein the lower surface contacts the first layer. The structure further includes a liquid layer disposed over the fin structure of the bottom layer and a top layer including a fin structure and a top surface opposite the fin structure, wherein the fin structure of the top layer contacts the liquid layer. The structure further includes a seal positioned between the top layer and the bottom layer for restricting the liquid layer and a heat sink in contact with or integral with the top layer. The heat sink can be a typical air cooled heat sink or other heat sink such as a water cooled cold hat in contact with the top layer.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DETAILED DESCRIPTION

The present invention takes advantage of useful thermal and physical characteristics of liquid metal. In particular, liquid metal provides some amount of adhesive force when applied in a thin layer between two surfaces. The present invention utilizes liquid metal as a thermal interface material between a fin structure coupled to a microprocessor and a fin structure coupled to a heat sink. In an alternate embodiment, the present invention utilizes liquid metal as the thermal interface material between the microprocessor and the fin structure.

The present invention is advantageous as it provides compliance in a location other than (or in addition to) the gap area between the microprocessor and the heat spreader or other heat conducting part neighboring the microprocessor. Further, the liquid metal surface tension adhesion is used to maintain the microprocessor and the heat spreader in close proximity. The present invention is further advantageous as the forces on the microprocessor exerted by physical changes brought on by heat in the x, y and z directions are near zero. Further, the present invention allows for z-compliance by utilizing finned structures coupled with the liquid metal interface. Thus, the present invention eliminates the necessity for compliance in a film disposed between the microprocessor and a heat spreader or heat sink. Additionally, the present invention does not require the use of high-viscosity thermal paste, which is not effective in very thin layers.

Figure 1:
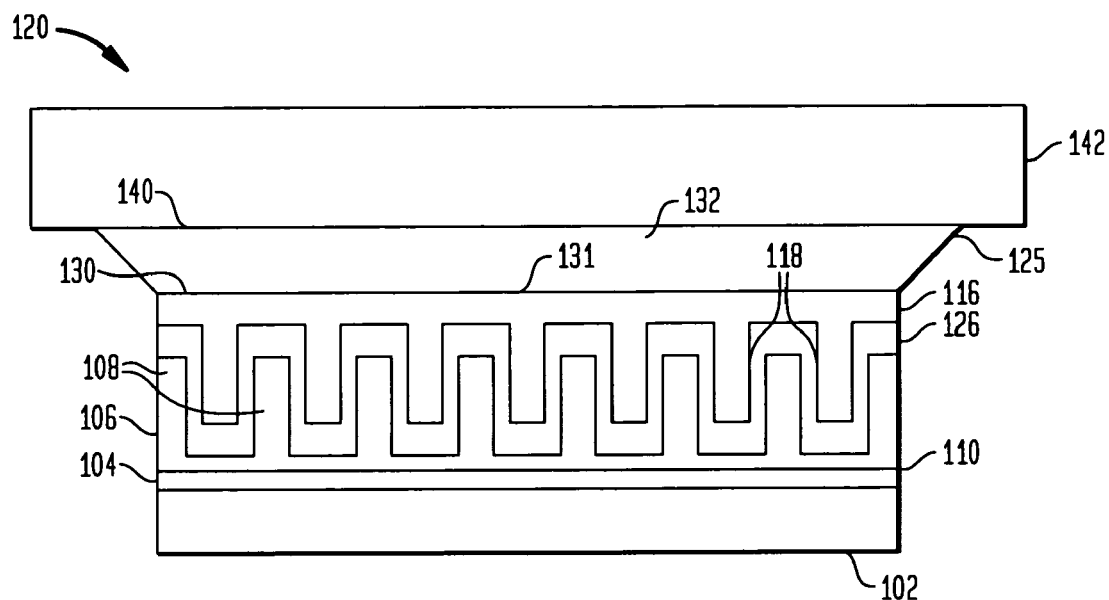
FIG. 1 is an illustration of a cooling structure, comprising a liquid layer, for an electronic device according to one embodiment of the present invention.

FIG. 1 is an illustration of a cooling structure, comprising a liquid layer, for an electronic device according to one embodiment of the present invention. FIG. 1 shows a heat-producing electronic device, a microprocessor 102, located along the bottom of the assembly 120. Disposed on the microprocessor 102 is a first layer 104, which can be a solid or liquid layer for providing a heat path from the microprocessor 102 to the upper elements of the assembly 120. The first layer 104 can be a solid heat-conducting layer or a liquid heat-conducting layer such as a liquid metal layer or a non-metal liquid layer. Examples of a solid heat-conducting layer used for this purpose are a thermally conductive paste, a thermally conductive adhesive and a solder such as indium. Examples of a non-metal liquid layer used for this purpose are oil and water Examples of a liquid metal layer used for this purpose are mercury, gallium and a gallium alloy such as with tin or indium. A liquid first layer 104 can be sealed so as to restrict the escape of the liquid from the desired area over the microprocessor 102.

The cooling structure assembly 120 further includes a bottom layer 106 including a fin structure 108 and a lower surface 110 opposite the fin structure 108, wherein the lower surface 110 contacts the first layer 104. The fin structure 108 comprises a plurality of fins extending in the upper direction away from the source of the heat, the microprocessor 102. The inclusion of the fins increases the surface area of the upper surface of the bottom layer 106, which serves to dissipate heat. Each fin draws heat away from the microprocessor 102 and allows the heat to radiate out from the increased surface area of the fins. The lower surface 110 of the bottom layer 106 is a planar surface that rests in contact with the first layer 104.

The cooling structure assembly 120 further includes a top layer 116 including a fin structure 118 and an upper surface 130 opposite the fin structure 118, wherein the upper surface 130 contacts a heat spreader 125. The fin structure 118 comprises a plurality of fins extending in the lower direction towards the source of the heat, the microprocessor 102. As in bottom layer 106, the inclusion of the fins increases the surface area of the lower surface of the top layer 116, which serves to dissipate heat. Each fin draws heat away from the microprocessor 102. The upper surface 130 of the top layer 116 is a planar surface that rests in contact with a heat spreader 125.

The cooling structure assembly 120 further includes a liquid layer 126 disposed between the bottom layer 106 and the top layer 116. The liquid nature of the liquid layer 126 allows the substance to fill the areas created by the gap created between the fins structures of the bottom layer 106 and the top layer 116. The liquid layer 126 provides a heat path from the microprocessor 102 to the upper elements of the assembly 120 as the heat travels from the fins of the bottom layer 106 to the fins of the top layer 116. The liquid layer 126 is a liquid heat-conducting layer such as a liquid metal layer or a non-metal liquid layer similar to the properties of the liquid embodiment of the first layer 104, described in greater detail above. The liquid layer 126 can be sealed so as to restrict the escape of the liquid from the desired area between the bottom layer 106 and the top layer 116.

The cooling structure assembly 120 further includes a heat spreader 125 in contact with the upper surface 130 of the top layer 116. Note that the upper surface 132 of the heat spreader 125 is wider and of a larger surface area than its bottom surface 131. The heat spreader 125 works to absorb heat and spread it from its bottom surface 131 to its upper surface 132 having an increased surface area for radiating and transferring heat. The planar bottom surface 131 of the heat spreader 125 contacts the planar upper surface 130 of the top layer 116 to provide a heat path to the heat sink 142, with which the heat spreader 125 is in contact. A heat sink works as a heat repository for absorbing the heat that is produced by the microprocessor 102. The heat sink 142 can be a typical air cooled heat sink or other heat sink such as a water cooled cold hat in contact with the top layer. The planar upper surface 132 of the heat spreader 125 contacts the planar bottom surface 140 of the heat sink 142. In an embodiment of the present invention, the heat sink 142 is integrated with the heat spreader 125 or the top layer 116.

Figure 2:
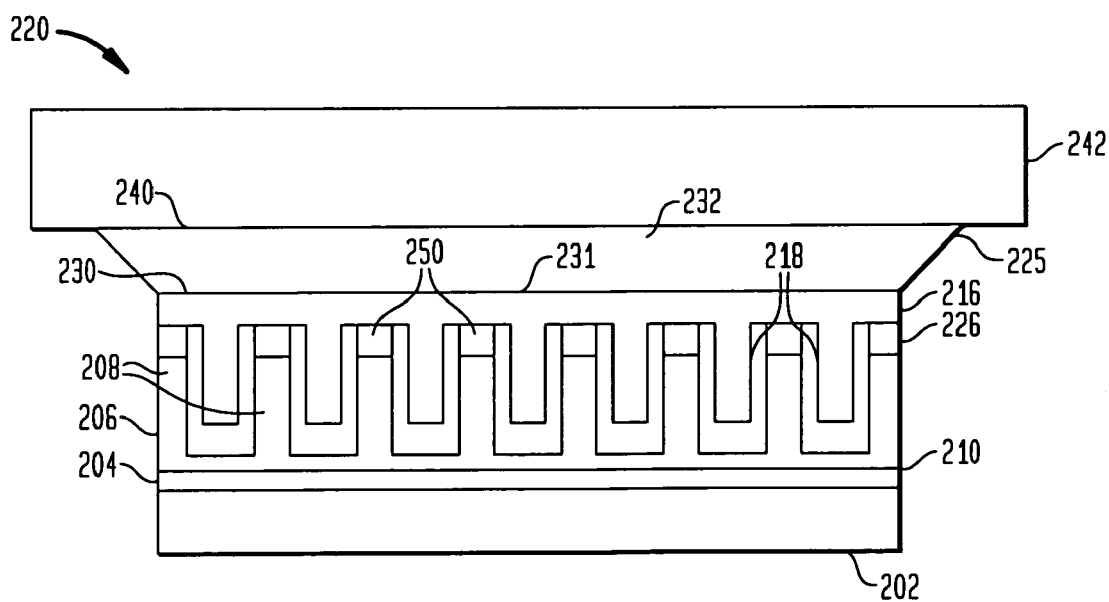
FIG. 2 is an illustration of a cooling structure, comprising a liquid layer and at least one non-wetting element, for an electronic device according to one embodiment of the present invention.

FIG. 2 is an illustration of a cooling structure, comprising a liquid layer and at least one non-wetting element, for an electronic device according to one embodiment of the present invention. The cooling structure assembly 220 of FIG. 2 is similar to the cooling structure assembly 120 of FIG. 1.

FIG. 2 shows the microprocessor 202, located along the bottom of the assembly 220 and a first layer 204, similar to first layer 104, disposed on the microprocessor 202. The cooling structure assembly 220 further includes a bottom layer 206, similar to bottom layer 106, including a fin structure 208 and a lower surface 210 opposite the fin structure 208, wherein the lower surface 210 contacts the first layer 204. Also included is a top layer 216, similar to top layer 116, including a fin structure 218 and an upper surface 230 opposite the fin structure 218, wherein the upper surface 230 contacts a heat spreader 225. Further included is a liquid layer 226, similar to liquid layer 126, disposed between the bottom layer 206 and the top layer 216.

FIG. 2 further includes at least one non-wetting element 250 that is disposed between the bottom layer 206 and the top layer 216. The at least one non-wetting element 250 comprises a material such as an oxide layer or paint. The at least one non-wetting element 250 reduces the adhesive force generated if the gap between bottom layer 205 and top layer 216 becomes liquid-filled.

The cooling structure assembly 220 further includes a heat spreader 225 in contact with the upper surface 230 of the top layer 216. The planar upper surface 232 of the heat spreader 225 contacts the planar bottom surface 240 of the heat sink 242. The heat sink 242 can be a typical air cooled heat sink or other heat sink such as a water cooled cold hat in contact with the top layer. In an embodiment of the present invention, the heat sink 242 is integrated with the heat spreader 225 or the top layer 216.

Figure 3:
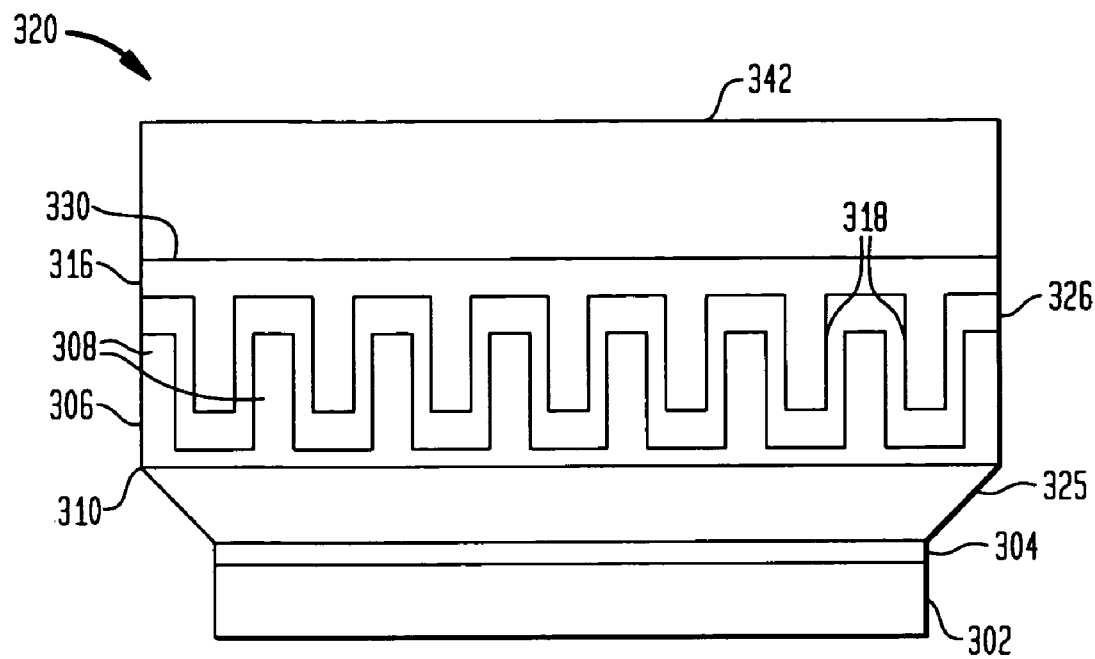
FIG. 3 is an illustration of a cooling structure, comprising a liquid layer and an alternate heat spreader arrangement, for an electronic device according to one embodiment of the present invention.

FIG. 3 is an illustration of a cooling structure, comprising a liquid layer and an alternate heat spreader arrangement, for an electronic device according to one embodiment of the present invention. The cooling structure assembly 320 of FIG. 3 is similar to the cooling structure assembly 120 of FIG. 1.

FIG. 3 shows the microprocessor 302, located along the bottom of the assembly 320 and a first layer 304, similar to first layer 104, disposed on the microprocessor 302. The cooling structure assembly 320 further includes a heat spreader 325 in contact with a lower surface 310 of a bottom layer 306. The cooling structure assembly 320 further includes a bottom layer 306, similar to bottom layer 106, including a fin structure 308 and a lower surface 310 opposite the fin structure 308. Also included is a top layer 316, similar to top layer 116, including a fin structure 318 and an upper surface 330 opposite the fin structure 318. Further included is a liquid layer 326, similar to liquid layer 126, disposed between the bottom layer 306 and the top layer 316. The cooling structure assembly 320 further includes a heat sink 342 in contact with the upper surface 330 of the top layer 316. The heat sink 342 can be a typical air cooled heat sink or other heat sink such as a water cooled cold hat in contact with the top layer. In an embodiment of the present invention, the heat sink 342 is integrated with the top layer 316.

Figure 4:
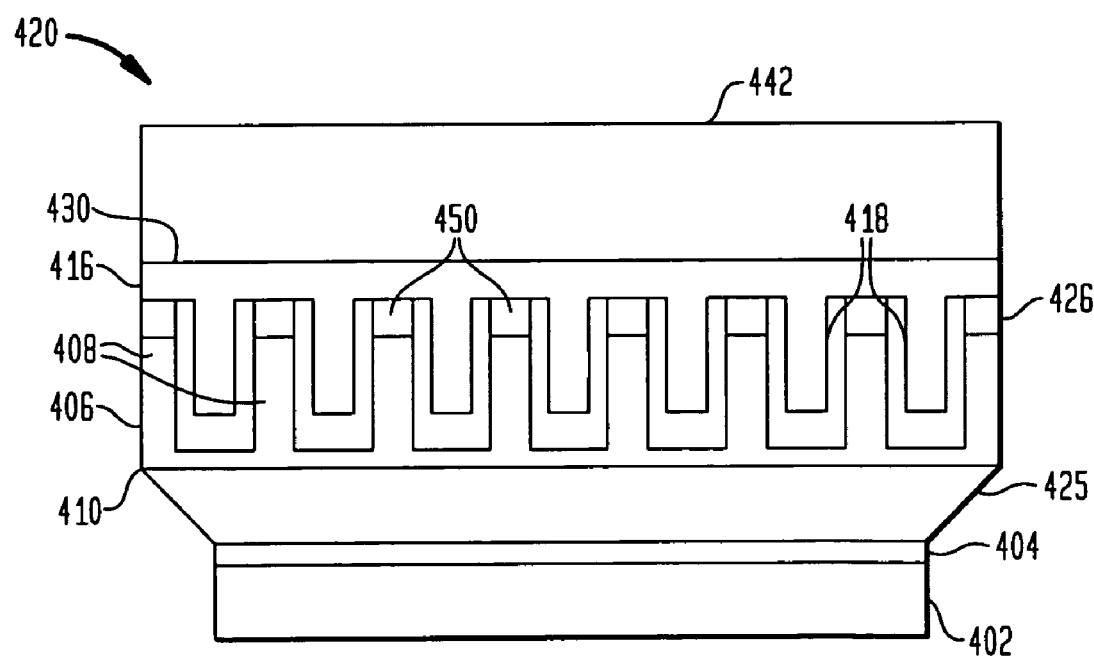
FIG. 4 is an illustration of a cooling structure, comprising a liquid layer and at least one spring element, for an electronic device according to one embodiment of the present invention.

FIG. 4 is an illustration of a cooling structure, comprising a liquid layer and at least one spring element, for an electronic device according to one embodiment of the present invention. The cooling structure assembly 420 of FIG. 4 is similar to the cooling structure assembly 120 of FIG. 1.

FIG. 4 shows the microprocessor 402, located along the bottom of the assembly 420 and a first layer 404, similar to first layer 104, disposed on the microprocessor 402. The cooling structure assembly 420 further includes a heat spreader 425 in contact with a lower surface 410 of a bottom layer 406. The cooling structure assembly 420 further includes a bottom layer 406, similar to bottom layer 106, including a fin structure 408 and a lower surface 410 opposite the fin structure 408. Also included is a top layer 416, similar to top layer 116, including a fin structure 418 and an upper surface 430 opposite the fin structure 418. Further included is a liquid layer 426, similar to liquid layer 126, disposed between the bottom layer 406 and the top layer 416.

FIG. 4 further includes at least one spring element 450 that is disposed between the bottom layer 406 and the top layer 416 so as to contact both the bottom layer 406 and the top layer 416. The at least one spring element 450 comprises a spring such as a leaf spring or a helix spring for offering resistance when loaded. The at least one spring element 450 provides compliance between the bottom layer 406 and the top layer 416 and works to keep the bottom layer 406 in close proximity to the microprocessor 402. The cooling structure assembly 420 further includes a heat sink 442 in contact with the upper surface 430 of the top layer 416. The heat sink 442 can be a typical air cooled heat sink or other heat sink such as a water cooled cold hat in contact with the top layer. The cooling structure assembly 420 further includes a heat sink 442 in contact with the upper surface 430 of the top layer 416. In an embodiment of the present invention, the heat sink 442 is integrated with the top layer 416.

Figure 5:
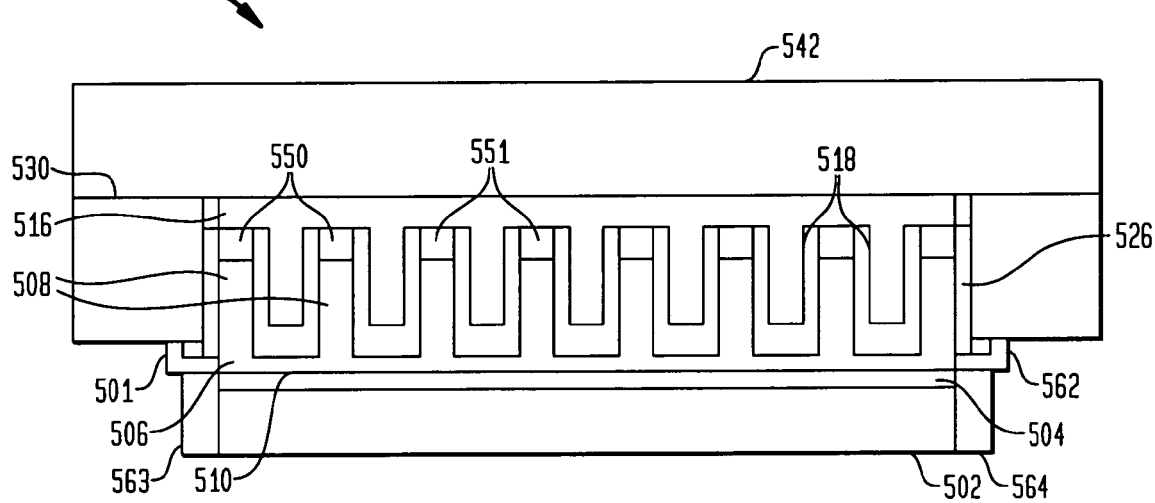
FIG. 5 is an illustration of a cooling structure, comprising a liquid layer, at least one spring element and at least one non-wetting element, for an electronic device according to one embodiment of the present invention.

FIG. 5 is an illustration of a cooling structure, comprising a liquid layer, at least one spring element and at least one non-wetting element, for an electronic device according to one embodiment of the present invention. The cooling structure assembly 520 of FIG. 5 is similar to the cooling structure assembly 120 of FIG. 1.

FIG. 5 shows the microprocessor 502, located along the bottom of the assembly 520 and a first layer 504, similar to first layer 104, disposed on the microprocessor 502. The cooling structure assembly 520 further includes a bottom layer 506, similar to bottom layer 106, including a fin structure 508 and a lower surface 510 opposite the fin structure 508, wherein the lower surface 510 contacts the first layer 504. Also included is a top layer 516, similar to top layer 116, including a fin structure 518 and an upper surface 530 opposite the fin structure 518, wherein the upper surface 530 contacts a heat spreader 525. Further included is a liquid layer 526, similar to liquid layer 126, disposed between the bottom layer 506 and the top layer 516.

FIG. 5 further includes at least one non-wetting element 550 that is disposed between the bottom layer 506 and the top layer 516 so as to contact both the bottom layer 506 and the top layer 516. FIG. 5 further includes at least one spring element 551 that is disposed between the bottom layer 506 and the top layer 516 so as to contact both the bottom layer 506 and the top layer 516. The at least one non-wetting element 550 and the at least one spring element 551 provide compliance between the bottom layer 506 and the top layer 516 and works to transfer the heat produced by the microprocessor 502 to the heat sink 542. The planar upper surface of the top layer 516 contacts the planar bottom surface of the heat sink 542. The heat sink 542 can be a typical air cooled heat sink or other heat sink such as a water cooled cold hat in contact with the top layer. In an embodiment of the present invention, the heat sink 542 is integrated with the top layer 516.

FIG. 5 further shows a seal 561, 562 positioned between the top layer 516 and the bottom layer 506 for restricting the liquid layer 526 from escaping out of the desired area. FIG. 5 further shows a seal 563, 564 positioned between the top layer 516 and the bottom layer 506 for restricting the liquid layer 564 from escaping out of the desired area.

Figure 6:
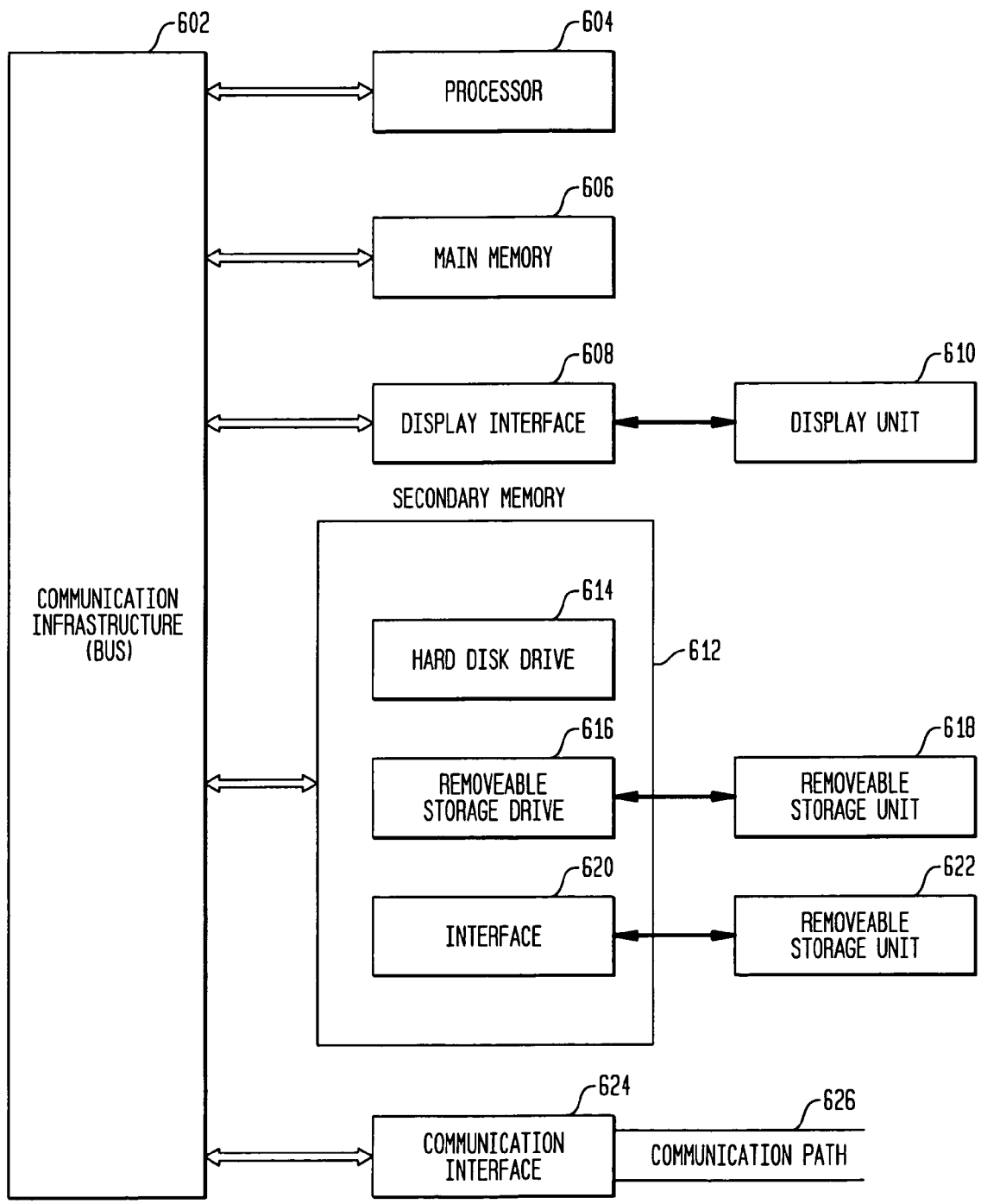
FIG. 6 is a high level block diagram showing an information processing system useful for implementing one embodiment of the present invention.

The present invention can be utilized for cooling any of a variety of electronic devices. In one embodiment of the present invention, the present invention is used to cool a microprocessor of an information processing system such as a computer. FIG. 6 is a high level block diagram showing an information processing system useful for implementing one embodiment of the present invention. The computer system includes one or more processors, such as processor 604. The processor 604 is connected to a communication infrastructure 602 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 608 that forwards graphics, text, and other data from the communication infrastructure 602 (or from a frame buffer not shown) for display on the display unit 610. The computer system also includes a main memory 606, preferably random access memory (RAM), and may also include a secondary memory 612. The secondary memory 612 may include, for example, a hard disk drive 614 and/or a removable storage drive 616, representing a floppy disk drive, a magnetic tape drive, an optical disk drive, etc. The removable storage drive 616 reads from and/or writes to a removable storage unit 618 in a manner well known to those having ordinary skill in the art. Removable storage unit 618, represents a floppy disk, a compact disc, magnetic tape, optical disk, etc. which is read by and written to by removable storage drive 616. As will be appreciated, the removable storage unit 618 includes a computer readable medium having stored therein computer software and/or data.

In alternative embodiments, the secondary memory 612 may include other similar means for allowing computer programs or other instructions to be loaded into the computer system. Such means may include, for example, a removable storage unit 622 and an interface 620. Examples of such may include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to the computer system.

The computer system may also include a communications interface 624. Communications interface 624 allows software and data to be transferred between the computer system and external devices. Examples of communications interface 624 may include a modem, a network interface (such as an Ethernet card), a communications port, a PCMCIA slot and card, etc. Software and data transferred via communications interface 624 are in the form of signals which may be, for example, electronic, electromagnetic, optical, or other signals capable of being received by communications interface 624. These signals are provided to communications interface 624 via a communications path (i.e., channel) 626. This channel 626 carries signals and may be implemented using wire or cable, fiber optics, a phone line, a cellular phone link, an RF link, and/or other communications channels.

In this document, the terms "computer program medium," "computer usable medium," an "computer readable medium" are used to generally refer to media such as main memory 606 and secondary memory 612, removable storage drive 616, a hard disk installed in hard disk drive 614, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information.

Computer programs (also called computer control logic) are stored in main memory 606 and/or secondary memory 612. Computer programs may also be received via communications interface 624. Such computer programs, when executed, enable the computer system to perform the features of the present invention as discussed herein. In particular, the computer programs, when executed, enable the processor 604 to perform the features of the computer system. Accordingly, such computer programs represent controllers of the computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

I claim:

1. A structure for cooling an electronic device having a top and bottom surface, the structure comprising:
    a first layer disposed substantially over the entire top surface of the electronic device for providing a heat path from the electronic device;
    a bottom layer including a fin structure and a lower surface opposite the fin structure, wherein the lower surface contacts the first layer;
    a liquid layer disposed over the fin structure of the bottom layer;
    a top layer including a fin structure and a top surface opposite the fin structure, wherein the fin structure of the top layer contacts the liquid layer;
    a heat sink in contact with or integral with the top layer;
    a heat spreader in contact with or integral with the heat sink, the heat spreader having an increased surface area for radiating and transferring heat; and
    at least one non-wetting element disposed between the fin structure of the bottom layer and the fin structure of the top layer.

2. The structure of claim 1, wherein the electronic device comprises a processor.

3. The structure of claim 1, wherein the first layer comprises a solid heat-conducting material including any one of: thermally conductive paste; thermally conductive adhesive; solder; and indium.

4. The structure of claim 1, wherein the first layer is a sealed liquid heat-conducting material.

5. The structure of claim 1, wherein the first layer is a liquid metal.

6. The structure of claim 1, wherein the first layer is a non-metal liquid comprising any one of: oil; and water.

7. The structure of claim 1, wherein the liquid layer is sealed.

8. The structure of claim 1, wherein the liquid layer is a liquid metal.

9. The structure of claim 1, wherein the liquid layer is a non-metal liquid comprising any one of: oil; and water.

10. The structure of claim 1, wherein the distance between the fin structure of the bottom layer and the fin structure of the top layer is approximately 0.05 mm to approximately 0.1 mm.

11. The structure of claim 1, further comprising: at least one spring element disposed between and in contact with the fin structure of the bottom layer and the fin structure of the top layer.

12. The structure of claim 1, further comprising: at least one spring clement disposed between and in contact with the fin structure of the bottom layer and the fin structure of the top layer.

13. The structure of claim 1, further comprising: a heat spreader disposed between the first layer and the lower surface of the bottom layer.

14. The structure of claim 13, further comprising: at least one spring element disposed between and in contact with the fin structure of the bottom layer and the fin structure of the top layer.

15. The structure of claim 14, wherein the at least one spring element comprises a leaf spring.

16. The structure of claim 1, further comprising: at least one non-wetting element disposed between the fin structure of the bottom layer and the fin structure of the top layer.

17. A structure for cooling an electronic device having a top and bottom surface, the structure comprising:

- a first layer disposed substantially over the entire top surface of the electronic device for providing a heat path from the electronic device;
- a bottom layer including a fin structure and a lower surface opposite the fin structure, wherein the lower surface contacts the first layer;
- a liquid layer disposed over the fin structure of the bottom layer;
- a top layer including a fin structure and a top surface opposite the fin structure, wherein the fin structure of the top layer contacts the liquid layer;
- a heat sink in contact with or integral with the top layer;
- a heat spreader disposed between the first layer and the lower surface of the bottom layer;
- at least one spring element disposed between and in contact with the fin structure of the bottom layer and the fin structure of the top layer; and
- at least one non-wetting element disposed between the fin structure of the bottom layer and the fin structure of the top layer.

* * * * *